May 2, 1967 YASUO TAGAWA 3,317,858
ELECTROMECHANICAL FILTER OF CHANNEL SEPARATION FILTER TYPE COMPRISING MAGNETOSTRICTION BAR RESONATORS
Filed Aug. 13, 1964
FIG. 1
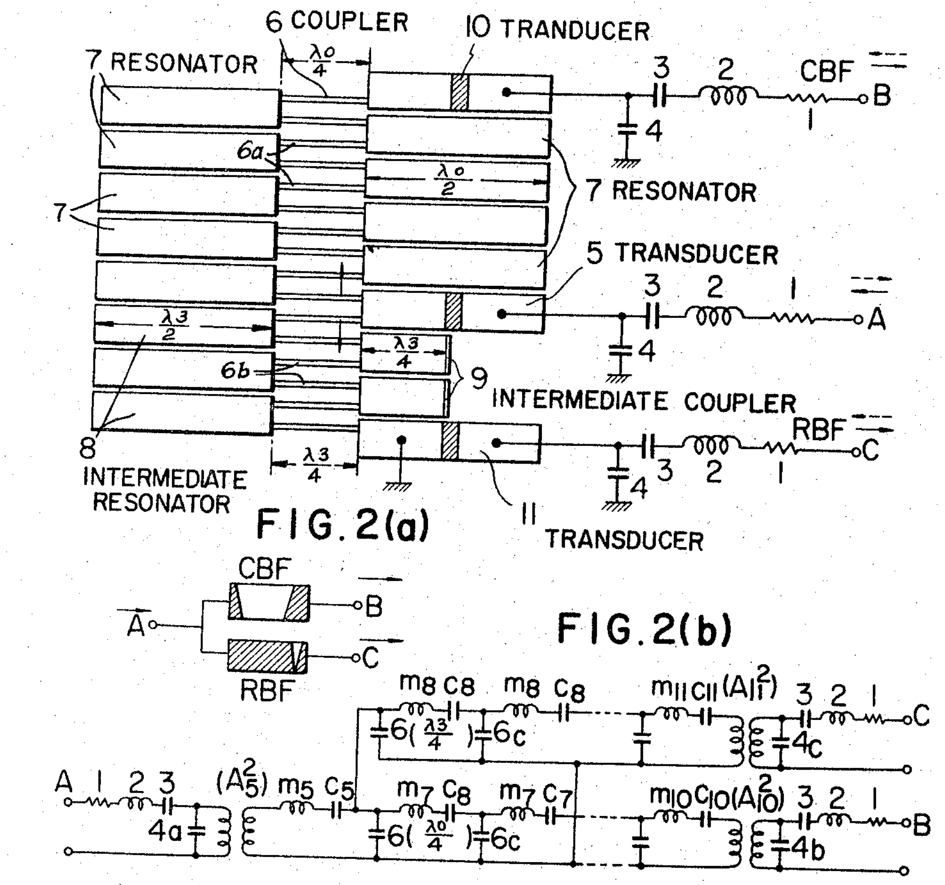
FIG. 2(a) FIG. 2(b)
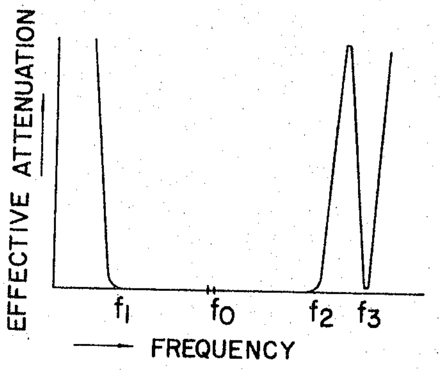
FIG. 3

United States Patent Office 3,317,858

Patented May 2, 1967

3,317,858
ELECTROMECHANICAL FILTER OF CHANNEL SEPARATION FILTER TYPE COMPRISING MAGNETOSTRICTION BAR RESONATORS

Yasuo Tagawa, Tokyo-to, Japan, assignor to Kokusai Denki Kabushiki Kaisha, Tokyo-to, Japan, a joint-stock company of Japan Filed Aug. 13, 1964, Ser. No. 389,381
Claims priority, application Japan, Aug. 23, 1963, 38/43,936
3 Claims. (Cl. 333—6)

This invention relates to a new electromechanical filter having functions which, in actual practice, are highly effective in applications to channel filters and ringer filters in carrier telephone terminal equipment, and relates to an improved electromechanical filter according to U.S.A. Patent No. 3,028,564 patented Apr. 3, 1962.

It is an object of the invention to provide the functions of a channel filter and a ringer filter in a channel conversion part by means of a mechanical filter of a combination type and to provide an electromechanical filter of the channel separation filter type having both the functions of a channel filter and a ringer filter.

It is a principal boject to provide an electromechanical filter of the above stated character having great advantages in miniaturization, stabilization, and economical design.

With the foregoing and other objects in view, the invention resides in the novel arrangement and combination of parts as hereinafter more particularly described, reference being made to the accompanying drawing, in which like parts are designated by like reference characters, and in which:

FIGURE 1 is a schematic diagram, partly in block form, showing the general arrangement and composition of the embodiment of the electromechanical filter according to the invention;

FIGURE 2($a$) and 2($b$) are, respectively, a diagram for a description of the operation of the filter shown in FIGURE 1 and an equivalent circuit diagram for the filter; and FIGURE 3 is a graphical representation representative of one example of the dual function characteristic of a filter according to the invention.

Referring to FIGURE 1, a telephone or voice input and a ringer input are applied through a terminal A, of a filter according to the invention are first subjected in common to impedance transformation by a T-end matching circuit element, a resistance 1, an inductance 2, a series capacitor 3, and a parallel capacitor 4, thereby are transmitted with small dissipation, and are then applied to a common input electromechanical transducer 5. The transducer 5 is a piezoelectric vibrator of knonw cylindrical bar form wherein, in its central part along its length is disposed a piezoelectric ceramic, for example, a lead zirconate-titanate ceramic which has been subjected to polarization treatment. The ceramic is sandwiched between constant modulus alloy members at its two ends, and the metal members at the ends are adapted to be piezoelectric terminals. This transducer 5 elongates and contacts longitudinally in accordance with the frequency of the voltage impressed on it and converts the input signal to mechanical vibrations.

Above the transducer 5, as viewed in FIG. 1, there is provided a multiple section mechanical filter comprising a first group of mechanical bar resonators 7 which are connected in series between the other or inner end of the common transducer 5 and an electromechanical transducer 10 and are coupled together as shown in FIG. 1 by coupling pins or couplers **6*a*. The length of the couplers 6*a* between the lowermost bar resonator 7 and the inner end of the transducer 5 is equal to one quarter wave-length $\lambda_0/4$ at the center frequency of a channel band-pass filter CBF, $f_0$ while the remaining couplers 6*a* may have a length of $\lambda_0/4$ or less. The length of each bar resonator 7 is queal to $\lambda_0/2$, as shown in FIG. 1. The output of this filter CBF is passed through an output transducer 10 converting mechanical vibrations to an electrical output and a matching circuit which consists of a resistance 1, an inductance 2, a capacitor 3 and a capacitor 4** and is functionally the same as that of the input circuit and is transmitted to a terminal B.

Beneath the transducer 5, there is a second group of mechanical bar resonators 8 and 9 which are connected in series between a third electromechanical output transducer 11 and the inner end of the common transducer 5 by means of coupling pins or couplers **6*b*. The length of the couplers 6*b* beween the uppermost bar resonator 8 and the transducer 5 is equal to one quarter wave-length $\lambda_3/4$ at a ringing frequency, $f_3$, and the length of the remaining couplers 6*b* may be $\lambda_3/4$. The second group in this embodiment comprises, for example, three bar vibrators 8 of the length $\lambda_3/2$ and two vibrators 9 of the length $\lambda_3/4$. The cross sectional areas of vibrators 7, 8 and 9 are equal, whereby a narrow band ring filter (hereinafter referred to as RBF) is formed. The output of this RBF is passed through a transducer 11 and a matching circuit which consists of a resistance 1, an inductance 2, a capacitor 3 and a capacitor 4** and is functionally the same as that of the input circuit and then transmitted to a terminal C.

That is, the voice input and the ringer input which have entered through the input terminal A are respectively provided with ample selectivity and emerge in channel separated form at the output terminals B and C. In this case, the reactions of the branch impedances created at the load ends of the transducers arise principally at a frequency outside of their respective bands, that is, at a frequency of a high impedance range. Therefore, this reaction does not have an effect on the pass band characteristics of the respective filters. Rather, it can have the function of improving the respective attenuation characteristics. Furthermore, the couplings of the transducer used commonly for CBF and RBF and the branch filters are amply wide and cover the transmission band of CBF and RBF. Accordingly, the difference between the losses of the two filters is small.

While the case were an input entering through the terminal A is separated into outputs through terminals B and C is described above, it can be shown that when an input CBF is introduced through the terminal B, and an input RBF is introduced through the terminal C, their combined output can be obtained at the terminal A, that is, the filter arrangement is fully reversible.

In the coupling of one intermediate coupler 9 ($\lambda_3/4$ length) and the two couplers **6*b* (each of $\lambda_3/4$ length) at the load end of the intermediate coupler 9, the impedance thereof decreases to a value produced by multiplying the impedance of one coupler 6 by the square of the ratio of the impedances of the coupler 6 and of the intermediate coupler 9 (this ratio being equal to ratio of the respective cross sectional areas of these couplers). That is, a $\lambda/4$ transformation is accomplished. Therefore, by inserting this coupling 9 an RBF of a narrow fractional band of 1/100 or less relative to that of the coupling by only couplers 6*a*** is easily obtainable.

The operation of the filter shown in FIGURE 1 is indicated by the diagram of FIGURE 2($a$) and the equivalent circuit diagram of FIGURE 2($b$) in which the same or equivalent members as those in FIG. 1 are designated by like reference characters. In FIGURE 2($b$), reference numeral **4*a*, 4*c* and 4*b*, respectively, represent the sum of the parallelly connected capacitors 4 and the dampened capacitances of the transducers 5, 10 and 11, and the designations ($A_5^2$), ($A_{10}^2$), and ($A_{11}^2$) respectively represent the electromechanical impedance transformation ratios of the transducers 5, 10, and 11. Equivalent masses compliances of each part are shown in symbols $m_5$, $C_5$, $m_{10}$, $C_{10}$ and $m_{11}$, $C_{11}$ for transducers 5, 10 and 11, and $m_7$, $C_7$, and $m_8$, $C_8$ for resonators 7 and 8, respectively. Capacitances 6 indicate equivalent compliances of the couplers 6***a* and 6*b* represent the fact that the impedance of the coupling of the couplers is lowered by the intermediate coupler 9 by a multiple equal to the square of the ratio of the impedances of the couplers 6 and 9.

FIGURES 3 indicate the transmission characteristics of the separated outputs of CBF having transmission band width of frequencies $f_1$ to $f_2$ and RBF having narrow band width at frequencies of $f_3$.

While the foregoing disclosure relates to the case where one channel separation filter is coupled, it is obvious, of course, that two or more channel separation filters may be similarly coupled.

As described above, the electromechanical filter of channel separation filter type makes common use of transducers, and, moreover, it is possible to design the various resonators to have almost the same dimensions. Therefore, the electromechanical filter of the invention can be miniaturized and made economically, whereby it is effectively appreciable to numerous practical uses.

It should be understood, of course, that the foregoing disclosure relates to only a preferred embodiment of the invention and that it is intended to cover all changes and modifications of the example of the invention herein chosen for the purposes of the disclosure, which do not constitute departures from the spirit and scope of the invention as set forth in the appended claims.

I claim:

1. An electromechanical filter of the channel separation filter type comprising, a first electromechanical transducer, a second and a third electromechanical transducer, a first group of mechanical bar resonators serially connected between the first and second electromechanical transducers resonant at a first transmission frequency and having coupling pins having a length of one quarter wave-length at said first transmission frequency coupling the individual resonators of said first group, said first transmission frequency corresponding to a voice frequency band, each of said mechanical bar resonators of said first group having a length of one half wave-length at said first transmission frequency and the same vibration mode as said first transducer, a second group of mechanical bar resonators serially connected between said first and third transducers resonant at a second transmission frequency and having coupling pins having a length of one quarter wave-length at said second transmission frequency coupling the individual resonators of said second group, said second transmission frequency corresponding to a ringer circuit frequency, and said mechanical bar resonators of said second group comprise alternate bar resonators of one half wave-length and one quarter wave-length respectively of said second transmission frequency, whereby said first resonator is common to both of said groups and said groups have different pass-bands.

2. The electromechanical filter according to claim 1, having means to apply a separable input signal to said common electromechanical transducer, whereby output signals having different transmission band frequencies are independently derived out from said first and second electromechanical transducers, respectively.

3. The electromechanical filter according to claim 1, having means to apply to input signals having different transmission band frequencies independently, to said second and third electromechanical transducers, respectively, whereby a combined output of said two input signals is derived out from said common electromechanical transducer.

References Cited by the Examiner

UNITED STATES PATENTS

| | | | |
|---|---|---|---|
| 2,955,267 | 10/1960 | Mason | 333—71 |
| 3,013,228 | 12/1961 | Kettel et al. | 333—71 |
| 3,028,564 | 4/1962 | Tanaka et al. | 333—72 |

HERMAN KARL SAALBACH, *Primary Examiner.*

P. L. GENSLER, *Assistant Examiner.*